US006735546B2

(12) United States Patent
Scheuerlein (10) Patent No.: US 6,735,546 B2
(45) Date of Patent: May 11, 2004

(54) MEMORY DEVICE AND METHOD FOR TEMPERATURE-BASED CONTROL OVER WRITE AND/OR READ OPERATIONS

(75) Inventor: Roy E. Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/944,613

(22) Filed: Aug. 31, 2001

(65) Prior Publication Data
US 2003/0046020 A1 Mar. 6, 2003

(51) Int. Cl.[7] .................. G06F 15/00; G11C 29/00; G11C 7/04
(52) U.S. Cl. .................. 702/132; 365/201; 365/211
(58) Field of Search .................. 702/132, 130; 374/163, 176, 178; 365/189.01, 191, 195, 196, 211, 222, 201

(56) References Cited

U.S. PATENT DOCUMENTS

| 3,851,316 | A |   | 11/1974 | Kodama |
| 4,592,027 | A | * | 5/1986  | Masaki .................. 365/189.05 |
| 4,646,266 | A |   | 2/1987  | Ovshinsky et al. |
| 4,646,269 | A |   | 2/1987  | Wong et al. |
| 4,698,788 | A |   | 10/1987 | Flannagan et al. |
| 4,744,061 | A |   | 5/1988  | Takemae et al. |
| 4,873,669 | A |   | 10/1989 | Furutani et al. |
| 5,107,139 | A | * | 4/1992  | Houston et al. .................. 327/18 |
| 5,149,199 | A | * | 9/1992  | Kinoshita et al. ........... 374/178 |
| 5,276,649 | A |   | 1/1994  | Hoshita et al. |
| 5,278,796 | A |   | 1/1994  | Tillinghast et al. |
| 5,359,571 | A |   | 10/1994 | Yu |
| 5,383,157 | A |   | 1/1995  | Phelan |
| 5,410,512 | A |   | 4/1995  | Takase et al. |
| 5,784,328 | A | * | 7/1998  | Irrinki et al. ............... 365/222 |
| 5,835,396 | A |   | 11/1998 | Zhang |
| 5,890,100 | A | * | 3/1999  | Crayford .................. 702/130 |
| 5,925,996 | A |   | 7/1999  | Murray |
| 5,940,340 | A | * | 8/1999  | Ware et al. ............. 365/230.01 |
| 5,961,215 | A |   | 10/1999 | Lee et al. |
| 5,977,746 | A | * | 11/1999 | Hershberger et al. ........ 320/112 |
| 6,034,882 | A |   | 3/2000  | Johnson et al. |
| 6,034,918 | A |   | 3/2000  | Farmwald et al. |
| 6,055,180 | A |   | 4/2000  | Gudesen et al. |
| 6,070,222 | A |   | 5/2000  | Farmwald et al. |
| 6,185,712 | B1 |  | 2/2001  | Kirihata et al. |
| 6,212,121 | B1 |  | 4/2001  | Ryu et al. |
| 6,236,587 | B1 |  | 5/2001  | Gudesen et al. |
| 6,373,768 | B2 | * | 4/2002 | Woo et al. .................. 365/211 |
| 6,385,074 | B1 | * | 5/2002 | Johnson et al. ............. 365/103 |
| 6,560,152 | B1 |  | 5/2003  | Cernea ........................ 365/211 |

OTHER PUBLICATIONS

"A 14ns 1MB CMOS SRAM with Variable Bit–Organization," Wada et al., 1988 IEEE International Solid–State Circuits Conference, pp. 252–253 ( Feb. 19, 1988).
"Partial Selection of Passive Element Memory Cell Sub–Arrays for Write Operation," U.S. patent application Ser. No. 09/748,649, filed Dec. 22, 2000; inventors: Roy E. Scheuerlein and Matthew P. Crowley.
Information Disclosure Statement, 2 pages (Nov. 15, 2001).

* cited by examiner

Primary Examiner—John Barlow
Assistant Examiner—Meagan S. Walling
(74) Attorney, Agent, or Firm—Brinks Hofer Gilson & Lione (57) ABSTRACT

The preferred embodiments described herein provide a memory device and method for temperature-based control over write and/or read operations. In one preferred embodiment, the temperature of a memory array is monitored, and a write operation to the memory array is prevented in response to the monitored temperature reaching a threshold temperature. In another preferred embodiment, the temperature of a memory array is monitored, and a read operation from the memory array is prevented in response to the monitored temperature reaching a threshold temperature. Other preferred embodiments are provided, and each of the preferred embodiments can be used alone or in combination with one another.

72 Claims, 4 Drawing Sheets

MEMORY DEVICE AND METHOD FOR TEMPERATURE-BASED CONTROL OVER WRITE AND/OR READ OPERATIONS

BACKGROUND

Passive element memory arrays, such as anti-fuse diode cell arrays, require a high-voltage and high-current programming voltage source due to the large number of leakage paths in the array and the high voltage required to program the element conductivity. The write power dissipation is dominated by the power of the programming voltage source, and the write power increases the temperature of the memory. As the temperature of the diodes increases, the diode leakage current and the write power further increase, and this feedback can cause thermal run-away and failure of the memory. To reduce the chance of thermal run-away, the memory can be designed with smaller sub-arrays and a lower data rate. However, this design increases the cost per unit of storage capacity and results in a relatively slow memory device.

There is a need, therefore, for a memory device and method that will avoid thermal run-away while maintaining a relatively low cost and high data rate.

SUMMARY

The present invention is defined by the following claims, and nothing in this section should be taken as a limitation on those claims.

By way of introduction, the preferred embodiments described below provide a memory device and method for temperature-based control over write and/or read operations. In one preferred embodiment, the temperature of a memory array is monitored, and a write operation to the memory array is prevented in response to the monitored temperature reaching a threshold temperature. In another preferred embodiment, the temperature of a memory array is monitored, and a read operation from the memory array is prevented in response to the monitored temperature reaching a threshold temperature. Other preferred embodiments are provided, and each of the preferred embodiments can be used alone or in combination with one another.

The preferred embodiments will now be described with reference to the attached drawings.

DETAILED DESCRIPTION OF THE PRESENTLY PREFERRED EMBODIMENTS

Figure 1:
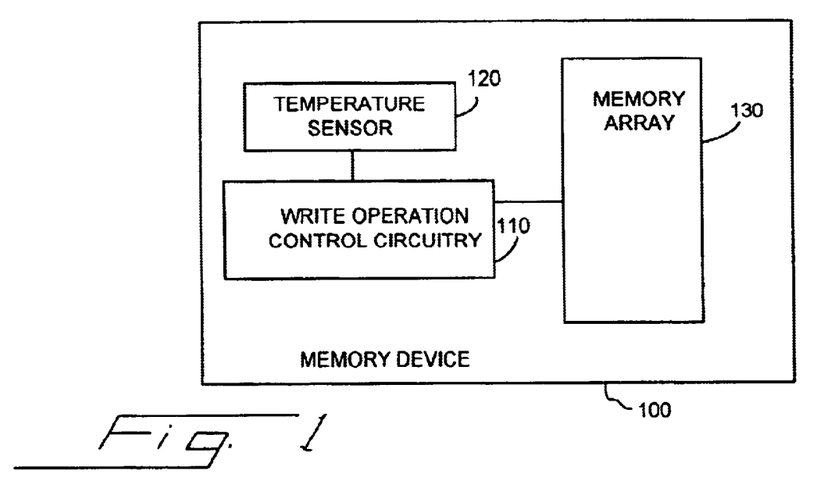
FIG. 1 is an illustration of a memory device of a preferred embodiment having a temperature sensor and write operation control circuitry.
Figure 2:
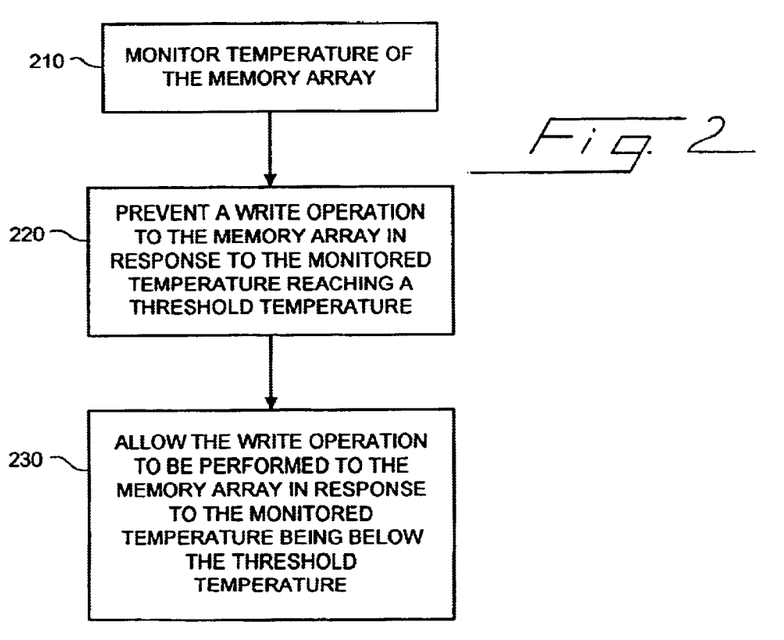
FIG. 2 is a flow chart of a method of a preferred embodiment for temperature-based control of a write operation.

Turning now to the drawings, FIG. 1 is an illustration of a memory device 100 of a preferred embodiment. The memory device 100 comprises write operation control circuitry 110 coupled with a temperature sensor 120 and a memory array 130. As used herein, the terms "coupled with" and "connected to" are intended broadly to cover elements that are coupled with or connected to one another either directly or indirectly through one or more intervening components. In this preferred embodiment, the memory device 100 implements a method for temperature-based control of a write operation, which is illustrated in the flow chart of FIG. 2. As shown in FIG. 2, the temperature of the memory array 130 is monitored (act 210). The temperature of the memory array 130 can be monitored directly or indirectly. For example, the temperature sensor 120 can be located on the same substrate that supports the memory array 130 (an "on-chip" temperature sensor), or the temperature sensor 120 can be located on another component housed by the housing of the memory device, such as interface circuitry (an "off-chip" temperature sensor).

Returning to the flow chart of FIG. 2, a write operation to the memory array 130 is prevented in response to the monitored temperature reaching a threshold temperature (act 220). The monitored temperature "reaches" the threshold temperature when the monitored temperature is at or above the threshold temperature. The term "reach" is also intended to cover the situation in which the monitored temperature is "reached" only when the monitored temperature is above (but not at) the threshold temperature. In response to the monitored temperature later falling below the threshold temperature, the write operation that was previously prevented is allowed to be performed to the memory array (act 230). As used herein, an action is performed "in response to" an event when that action is performed immediately after the event or at some time after the event (e.g., after a natural delay caused by circuit components or after an intentional delay introduced by a delay element).

The phrases "preventing a write operation" and "allowing a write operation to be performed" are intended to broadly refer to a wide range of applications. For example, if no write operations are in progress, the start of a new write operation can be prevented when the monitored temperature reaches the threshold temperature and later allowed to be performed when the monitored temperature falls below the threshold temperature. As another example, if a write operation is in progress, the in-progress write operation can be interrupted when the monitored temperature reaches the threshold temperature and later resumed when the monitored temperature falls below the threshold temperature. Alternatively, the in-progress write operation can be allowed to end and a new write operation can be prevented from starting. When the monitored temperature later falls below the threshold temperature, the new write operation is allowed to be performed.

Figure 3A:
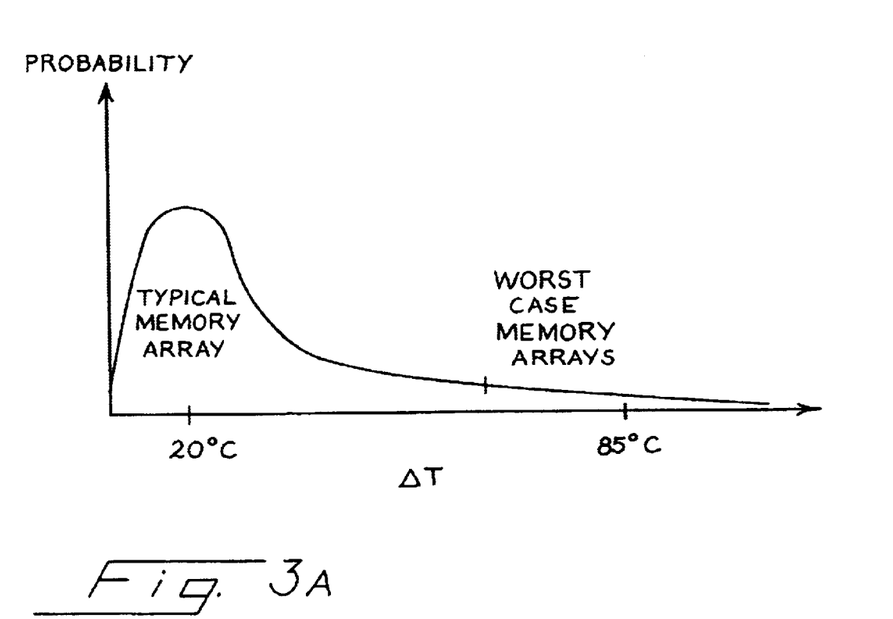
FIG. 3A is a graph showing a distribution of memory arrays versus temperature.
Figure 3B:
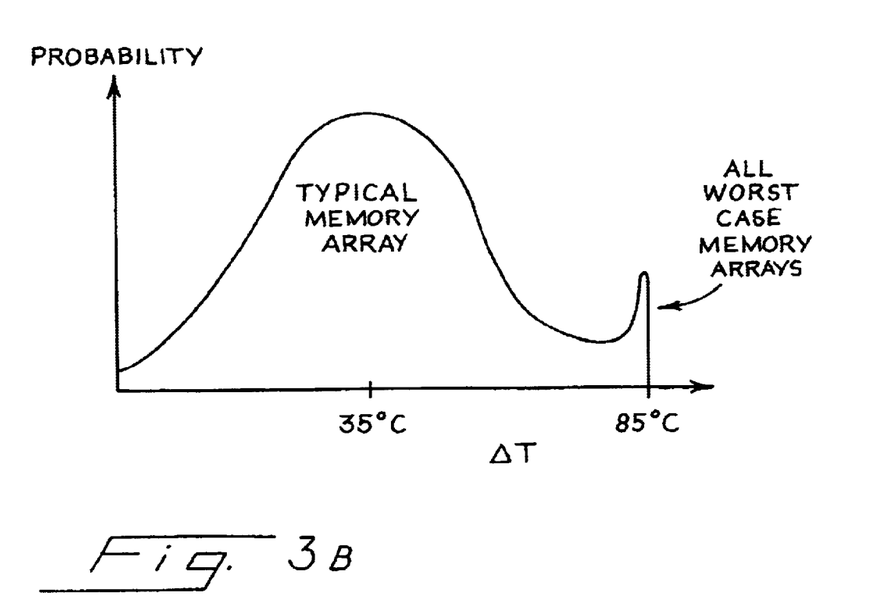
FIG. 3B is a graph showing a distribution of memory arrays with write operation control circuitry of a preferred embodiment versus temperature.

This preferred embodiment provides the advantage of avoiding thermal run-away while maintaining a high data rate. As described in the background section above, memory devices can be designed with a relatively low data rate to help avoid thermal run-away. As shown in the graph of FIG. 3A, the data rate is designed to be low enough so that both a typical memory array and most worst-case memory arrays (e.g., memory arrays with defects, poor heat transfer packaging, or high ambient temperatures) will operate below the thermal run-away temperature of 85° C. However, even with this design, some of the worst-case memory arrays operate above 85° C. and encounter thermal run-away. By using temperature-based write operation control circuitry, the average data rate can be designed to be two to four times higher, which results in most of the typical memory arrays operating at a higher temperature (35° C. instead of 20° C.), as shown in FIG. 3B. With this thermal cut-off technique, the temperature state is detected before initiating a predetermined sequence of write operations, and the data rate is reduced only when the temperature of the memory array reaches 85° C. (or some other threshold temperature). The typical memory array will not over-heat and, accordingly, will not be inhibited by the temperature-based write operation control circuitry. However, when a worst-case memory array reaches the threshold temperature, its data rate is reduced to avoid thermal run-away. Accordingly, the effective write data rate is lowered only for the worst-case memory arrays that dissipate high leakage power. A further benefit of this preferred embodiment is achieved if the thermal cut-off temperature is higher than the run-away temperature. Above the thermal run-away temperature, the memory will heat up at a faster rate but will not be damaged because the thermal sensor will interrupt the write operation and prevent further heating.

Figure 4:
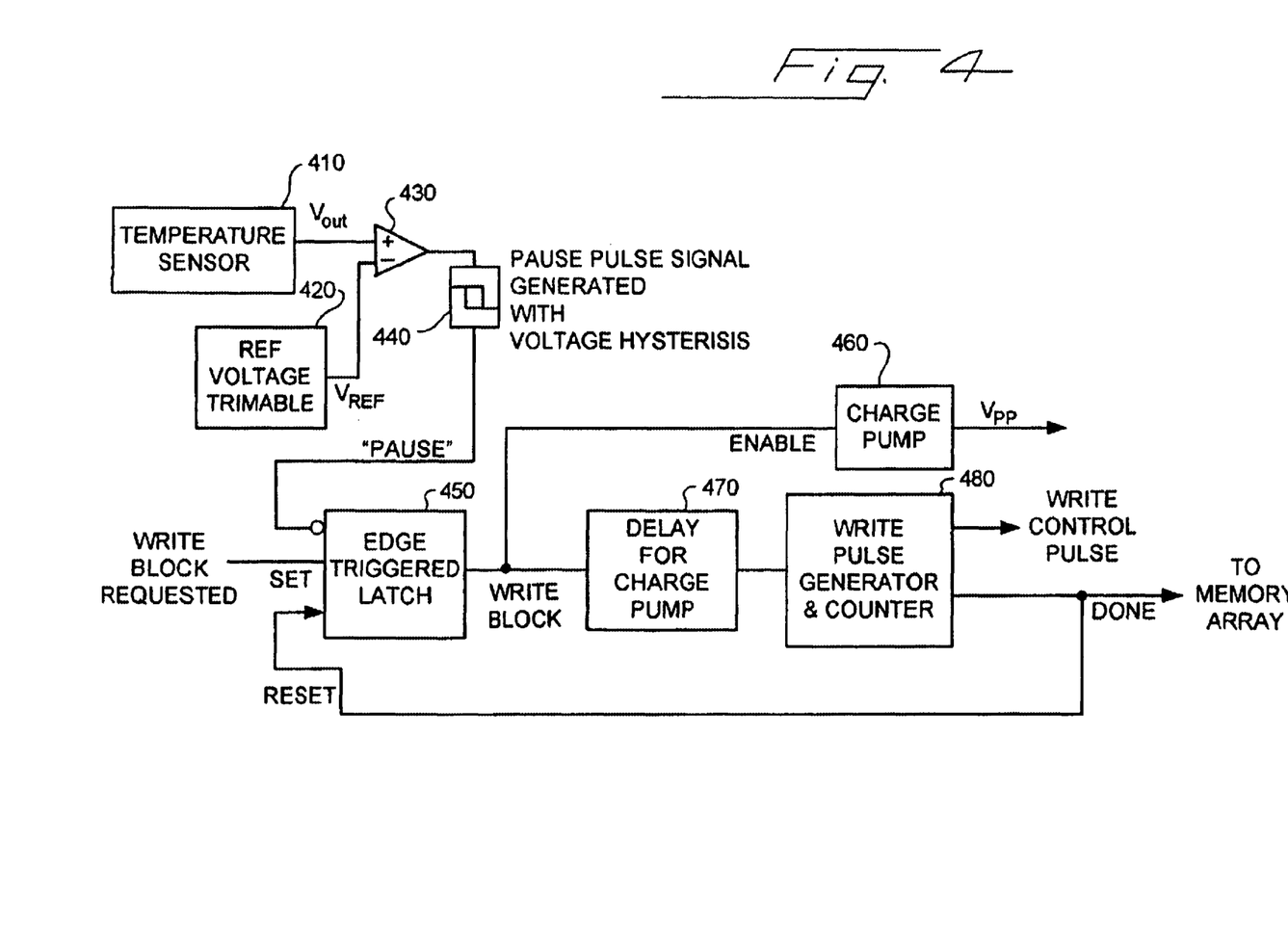
FIG. 4 is an illustration of a circuit of a preferred embodiment for temperature-based control of a write operation.

Turning again to the drawings, FIG. 4 is a circuit in a memory device of a preferred embodiment for temperature-based control of a write operation. As shown in FIG. 4, this circuit comprises a temperature sensor 410 and a reference voltage source 420 connected to a comparator 430. The output of the comparator 430 is connected to a pulse signal generator 440. The temperature sensor 410, reference voltage source 420, comparator 430, and pulse signal generator 440 form a temperature-controlled pulse circuit. The pulse signal generator 440 generates a pulse signal with voltage hysterisis and provides the pulse signal to an edge triggered flip-flop 450, which takes the form of a latch in this preferred embodiment. A write block requested signal is provided to the set input of the edge triggered latch 450, and a done signal from a write pulse generator and counter 480 is provided to the reset input of the edge triggered latch 450. The output of the edge triggered latch 450 is provided to a charge pump 460, which is an on-chip programming voltage source that supplies a voltage level $V_{pp}$ for programming memory cells, and a delay 470 for the charge pump. The delay 470, which can be implemented as a comparator that compares $V_{pp}$ to some desired reference voltage, is connected to the write pulse generator and counter 480. The write pulse generator and counter 480 comprises bitline/wordline selection circuitry and provides a write control pulse and a done signal to the memory array of the memory device. The done signal of the write pulse generator and counter 480 is also provided to the reset input of the edge triggered latch 450. The resetting of the latch 450 disables the charge pump 460, $V_{pp}$ falls, and the power dissipated in the leakage paths decreases. Alternatively, the resetting of the latch 450 can trigger a discharge method for the memory array, as described in "Method and Apparatus for Discharging Memory Array Lines," U.S. Patent application Ser. No. 09/897,784, filed Jun. 29, 2001 (MD-49). In either case, the voltages applied to the array decrease, and the power dissipated by the memory decreases.

In operation, the temperature sensor 410 either directly or indirectly senses the temperature of the memory array. Preferably, the temperature sensor 410 is located on the same silicon chip that comprises the memory array so that the sensed temperature is that of the memory array. Alternatively, the temperature sensor 410 can be located on another component, such as interface circuitry, that is housed within the housing of the memory device. The temperature sensor 410 provides a $V_{out}$ signal to the comparator 430, and the comparator 430 compares $V_{out}$ to a reference voltage ($V_{ref}$) from the reference voltage source 420. When $V_{out}$ reaches $V_{ref}$, the comparator 430 generates an output signal. In one preferred embodiment, the threshold temperature is 85° C., and $V_{ref}$ is 1.2 volts. To increase accuracy from about ±10° C. to about ±1° C., it is preferred that the reference voltage source 420 be trimable. In operation, a test component is heated to a desired threshold temperature, and non-volatile elements (e.g., a resistor tree) in the reference voltage source 420 are electrically adjusted until the comparator 430 provides an output signal. As an alternative to a trimable reference voltage source 420, a trimable temperature sensor 410 can be used.

When the temperature sensed by the temperature sensor 410 reaches the threshold temperature, the comparator 430 provides an output signal to the pulse signal generator 440. The pulse signal generator 440 generates a pulse signal (referred to herein as a "pause" pulse signal) that goes high when the monitored temperature reaches the threshold temperature and goes low when the monitored temperature is below the threshold temperature. Preferably, the pulse signal generator 440 generates the pause signal with voltage hysterisis so that there is a lag between a temperature drop and the effect of that drop. For example, instead of causing the pause signal to go low in response to a small drop in temperature (e.g., a 1 micro-volt drop), the pause signal can go low in response to a larger drop in temperature (e.g., a 100 milli-volt drop). Accordingly, the use of voltage hysterisis prevents the temperature-controlled pulse circuit from generating a rapid series of pause signals.

The pause signal is provided to the edge triggered latch 450, which latches a write block request signal upon the falling edge of the pause signal. If the temperature sensed by the temperature sensor 410 reaches the threshold temperature before a write block request goes high, the request is not latched, and the write-block signal is delayed. When the monitored temperature drops below the threshold temperature, the pause signal falls, and the falling edge of the pause signal latches the write block requested signal. The edge triggered latch 450 then provides a write block signal to enable the charge pump 460.

After a delay 470 to ensure that the charge pump 460 can provide a desired voltage for $V_{pp}$, the write pulse generator and counter 480 provides a series of write control pulses to the memory array to write a block of data (e.g., 512 bytes of data stored in a page register). To prevent the loss of data that can occur if an in-progress write operation is interrupted, the edge triggered latch 450 is reset only after the write pulse generator and counter 480 completes a block write. Accordingly, in this preferred embodiment, an in-progress write operation continues even if the temperature sensed by the temperature sensor 410 rises above the threshold temperature. If the sensed temperature is still high after the write pulse generator and counter 480 completes a block write, the edge triggered latch 450 will prevent a new write operation from being performed until the sensed temperature drops below the threshold temperature (i e., until the pause signal drops). As discussed above, the write-operation control circuitry can be altered such that an in-progress write operation is interrupted when the sensed temperature reaches the threshold temperature. When the write operation resumes, the previously-written data can be re-written into the memory array. Alternatively, a determination can be made of what bits in the page register were stored in the memory array, and only those bits that were not stored are written when the write operation resumes. Such a determination can be made from the counter value in the write pulse generator and counter 480 or from a pointer used to indicate the last bit written to the memory array.

In one preferred embodiment, the charge pump takes the form disclosed in "Multi-Stage Charge Pump," U.S. Patent application Ser. No. 09/809,878, and provides a programming pulse $V_{pp}$ of 9 to 10 volts. Additionally, the write pulse generator and counter 480 preferably uses the sensing-while-programming technique described in "Memory Device and Method for Sensing while Programming a Non-Volatile Memory Cell," U.S. Patent application Ser. No. 09/896,815. Additional programming techniques are disclosed in "Method and Apparatus for Writing Memory Arrays Using External Source of High Programming Voltage," U.S. Patent application Ser. No. 09/897,785 (Atty. Docket No. 023-0004 (MD-28)); "Method and Apparatus for Biasing Selected and Unselected Array Lines when Writing a Memory Array," U.S. Patent application Ser. No. 09/897,771 (Atty. Docket No. 023-0008 (MD-42)); and "Partial Selection of Passive Element Memory Cell Sub-Arrays for Write Operation," U.S. Patent application Ser. No. 09/748,649. Each of the patent documents cited in this paragraph is hereby incorporated by reference.

While the above-preferred embodiments discussed overheating caused during write operations, overheating can also occur during read operations. High read power can occur when the sub-array size is very large and many sub-arrays are selected simultaneously for high data rate. In antifuse diode memory arrays during read operations, the voltage across the leakage path reverse-biased diodes can be about 1.5 to 2.5 volts. Accordingly, the read mode leakage is less than the write mode leakage per sub-array. However, increasing the read mode data rate by selecting 64, 128, or more sub-arrays (versus selecting 2 to 8 sub-arrays for write) can lead to read powers that can cause overheating.

Figure 5:
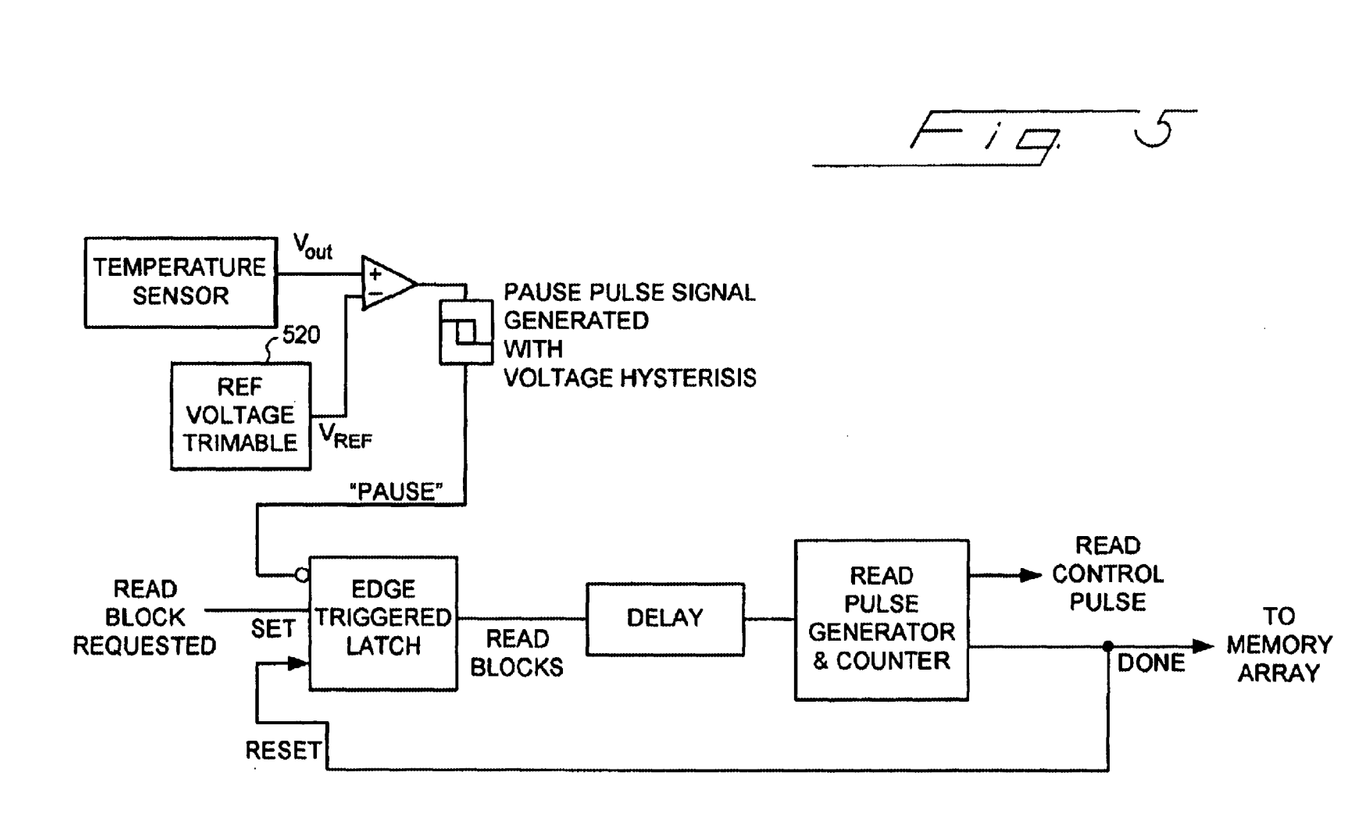
FIG. 5 is an illustration of a circuit of a preferred embodiment for temperature-based control of a read operation.

To prevent overheating in memories that have high read operation leakage power, it is preferred that read operation control circuitry be used to prevent the start of a read operation. Such read operation control circuitry can be used instead of or in addition to write operation control circuitry. FIG. 5 is an illustration of read operation control circuitry of a preferred embodiment. The operation of this circuitry is similar to that of the write operation control circuitry shown in FIG. 4. Because the diode leakage current in read mode is less than the diode leakage current in write mode, thermal run-away occurs at a higher temperature in read mode than in write mode. Accordingly, the threshold temperature can be greater in read mode than in write mode. As a result, the $V_{ref}$ generated by the reference voltage source 520 in the read operation control circuitry can be greater than the $V_{ref}$ generated by the reference voltage source 420 in the write operation control circuitry. The read operation control circuitry and write operation control circuitry can share a temperature sensor or use different temperature sensors. Additionally, any of the alternatives discussed above with respect to the write operation control circuitry can be used with the read operation control circuitry.

With any of these preferred embodiments, it is preferred that the memory array comprise a plurality of non-volatile passive element memory cells. These preferred embodiments provide particular advantage to high density memory arrays that use diode selection devices and apply high voltages to write to the array. Although any suitable type of memory cell can be used, in one preferred embodiment, the memory cell comprises an antifuse and a diode. In its unprogrammed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 1. Memory cells that support multiple programmed states can also be used. While write-many memory cells can be used, it is preferred that the memory cells be write-once memory cells. In a write-once memory cell, an original, un-programmed digital state of the memory cell (e.g., the Logic 1 state) cannot be restored once switched to a programmed digital state (e.g., the Logic 0 state). The memory cells can be made from any suitable material. The memory cells are preferably made from a semiconductor material; however, other materials such as phase-change materials and amorphous solids as well as those used with MRAM and organic passive element arrays can be used, as described in U.S. Pat. No. 6,055,180, which is hereby incorporated by reference.

Although any suitable memory array can be used, the memory array is preferably a three-dimensional memory array, which provides important economies in terms of reduced size and associated reductions in manufacturing cost. Suitable types of three-dimensional memory arrays are described in U.S. Pat. No. 6,034,882 to Johnson et al., U.S. Pat. No. 5,835,396 to Zhang, and U.S. patent application Ser. No. 09/560,626, all of which are hereby incorporated by reference. Additionally, in one preferred embodiment, the memory device takes the form of a compact, modular memory device that can be used with portable consumer products such as digital cameras, and the memory array of such a memory device is field-programmable, allowing the memory array to be programmed at a time after fabrication.

Lastly, "Memory Device and Method for Selectable Sub-Array Activation," U.S. patent application Ser. No. 09/943,655, filed on the same day as the present application, can be used with any of the preferred embodiments described herein and is hereby incorporated by reference.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for temperature-based control over a write operation to a memory array, the method comprising:
   (a) monitoring temperature of a memory array of a memory device; and
   (b) preventing a write operation to the memory array in response to the monitored temperature reaching a threshold temperature;
   wherein (b) is performed by at least one component in the memory device, wherein the memory device comprises a housing, and wherein the memory array and the at least one component are located within the housing.

2. The invention of claim 1, wherein the memory array is formed above a substrate, and wherein the temperature of the memory array is monitored in (a) with a temperature sensor located on the substrate.

3. The invention of claim 1, wherein the memory array is located within a housing of the memory device, and wherein the temperature of the memory array is monitored in (a) with a temperature sensor located within the housing.

4. The invention of claim 3, wherein the housing houses at least one component in addition to the memory array, and wherein the temperature of the memory array is monitored in (a) with a temperature sensor on the at least one component.

5. The invention of claim 1, wherein the act of preventing a write operation in (b) comprises preventing a start of a new write operation.

6. The invention of claim 1, wherein the act of preventing a write operation in (b) comprises allowing an in-progress write operation to end and preventing a start of a new write operation.

7. The invention of claim 1, wherein the act of preventing a write operation in (b) comprises interrupting an in-progress write operation.

8. The invention of claim 1 further comprising:
(c) allowing the write operation to be performed to the memory array in response to the monitored temperature being below the threshold temperature.

9. The invention of claim 8, wherein the act of preventing a write operation in (b) comprises preventing a start of a new write operation, and wherein the act of allowing the write operation to be performed in (c) comprises allowing the start of the new write operation.

10. The invention of claim 8, wherein the act of preventing a write operation in (b) comprises allowing an in-progress write operation to end and preventing a start of a new write operation, and wherein the act of allowing the write operation to be performed in (c) comprises allowing the start of the new write operation.

11. The invention of claim 8, wherein the act of preventing a write operation in (b) comprises interrupting an in-progress write operation, and wherein the act of allowing the write operation to be performed in (c) comprises resuming the in-progress write operation.

12. The invention of claim 1 further comprising:
(c) preventing a read operation from the memory array in response to the monitored temperature reaching a second threshold temperature.

13. The invention of claim 1, wherein the temperature is monitored in (a) with a first temperature sensor, and wherein the invention further comprises:
monitoring temperature of the memory array with a second temperature sensor; and
preventing a read operation from the memory array in response to the monitored temperature from the second temperature sensor reaching a second threshold temperature.

14. The invention of claim 1, wherein the memory array comprises a three-dimensional memory array.

15. The invention of claim 1, wherein the memory array comprises a plurality of antifuse memory cells.

16. The invention of claim 1, wherein the memory array comprises a plurality of write-once memory cells.

17. The invention of claim 1, wherein the memory array comprises a plurality of write-many memory cells.

18. A method for temperature-based control over a read operation from a memory array, the method comprising:
(a) monitoring temperature of a memory array of a memory device; and
(b) preventing a read operation from the memory array in response to the monitored temperature reaching a threshold temperature;
wherein (b) is performed by at least one component in the memory device, wherein the memory device comprises a housing, and wherein the memory array and the at least one component are located within the housing.

19. The invention of claim 18, wherein the memory array is formed above a substrate, and wherein the temperature of the memory array is monitored in (a) with a temperature sensor located on the substrate.

20. The invention of claim 18, wherein the memory array is located within a housing of the memory device, and wherein the temperature of the memory array is monitored in (a) with a temperature sensor located within the housing.

21. The invention of claim 20, wherein the housing houses at least one component in addition to the memory array, and wherein the temperature of the memory array is monitored in (a) with a temperature sensor on the at least one component.

22. The invention of claim 18, wherein the act of preventing a read operation in (b) comprises preventing a start of a new read operation.

23. The invention of claim 18, wherein the act of preventing a read operation in (b) comprises allowing an in-progress read operation to end and preventing a start of a new read operation.

24. The invention of claim 18, wherein the act of preventing a read operation in (b) comprises interrupting an in-progress read operation.

25. The invention of claim 18 further comprising:
(c) allowing the read operation to be performed to the memory array in response to the monitored temperature being below the threshold temperature.

26. The invention of claim 25, wherein the act of preventing a read operation in (b) comprises preventing a start of a new read operation, and wherein the act of allowing the read operation to be performed in (c) comprises allowing the start of the new read operation.

27. The invention of claim 25, wherein the act of preventing a read operation in (b) comprises allowing an in-progress read operation to end and preventing a start of a new read operation, and wherein the act of allowing the read operation to be performed in (c) comprises allowing the start of the new read operation.

28. The invention of claim 25, wherein the act of preventing a read operation in (b) comprises interrupting an in-progress read operation, and wherein the act of allowing the read operation to be performed in (c) comprises resuming the in-progress read operation.

29. The invention of claim 18 comprising:
(c) preventing a write operation to the memory array in response to the monitored temperature reaching a second threshold temperature.

30. The invention of claim 18, wherein the temperature is monitored in (a) with a first temperature sensor, and wherein the invention further comprises:
monitoring temperature of the memory array with a second temperature sensor; and
preventing a write operation to the memory array in response to the monitored temperature from the second temperature sensor reaching a second threshold temperature.

31. The invention of claim 18, wherein the memory array comprises a three-dimensional memory array.

32. The invention of claim 18, wherein the memory array comprises a plurality of antifuse memory cells.

33. The invention of claim 18, wherein the memory array comprises a plurality of write-once memory cells.

34. The invention of claim 18, wherein the memory array comprises a plurality of write-many memory cells.

35. A memory device comprising:
a memory array;
a temperature sensor; and
write operation control circuitry coupled with the memory array and the temperature sensor and operative to prevent a write operation to the memory array in response to a temperature sensed by the temperature sensor reaching a threshold temperature;

wherein the memory device comprises a housing, and wherein the memory array, the temperature sensor, and the write operation control circuitry are located within the housing.

36. The invention of claim 35, wherein the write operation control circuitry is further operative to allow the write operation to be performed in response to the temperature sensed by the temperature sensor being below the threshold temperature.

37. The invention of claim 35 further comprising read operation control circuitry coupled with the memory array and operative to prevent a read operation from the memory array.

38. The invention of claim 37, wherein the read operation control circuitry is operative to prevent the read operation in response to a temperature sensed by the temperature sensor reaching a second threshold temperature.

39. The invention of claim 37, further comprising a second temperature sensor coupled with the read operation control circuitry, and wherein the read operation control circuitry is operative to prevent the read operation in response to a temperature sensed by the second temperature sensor reaching a second threshold temperature.

40. The invention of claim 35, wherein the write-operation control circuitry comprises:
    a comparator operative to compare an output of the temperature sensor to a reference voltage;
    a pulse signal generator coupled with the comparator and operative to generate a pulse signal with voltage hysteresis; and
    an edge triggered flip flop coupled with the pulse signal generator.

41. The invention of claim 35, wherein the memory array comprises a plurality of antifuse memory cells.

42. The invention of claim 1, 18, or 35, wherein the threshold temperature comprises a thermal run-away temperature of the memory array.

43. The invention of claim 1, 18, or 35, wherein the threshold temperature comprises a temperature greater than a thermal run-away temperature of the memory array.

44. A memory device comprising:
    a memory array;
    a temperature sensor; and
    write operation control circuitry coupled with the memory array and the temperature sensor and operative to prevent a write operation to the memory array in response to a temperature sensed by the temperature sensor reaching a threshold temperature;
    wherein the memory array comprises a three-dimensional memory array.

45. The invention of claim 44, wherein the write operation control circuitry is further operative to allow the write operation to be performed in response to the temperature sensed by the temperature sensor being below the threshold temperature.

46. The invention of claim 44 further comprising read operation control circuitry coupled with the memory array and operative to prevent a read operation from the memory array.

47. The invention of claim 46, wherein the read operation control circuitry is operative to prevent the read operation in response to a temperature sensed by the temperature sensor reaching a second threshold temperature.

48. The invention of claim 46 further comprising a second temperature sensor coupled with the read operation control circuitry, and wherein the read operation control circuitry is operative to prevent the read operation in response to a temperature sensed by the second temperature sensor reaching a second threshold temperature.

49. The invention of claim 44, wherein the write-operation control circuitry comprises:
    a comparator operative to compare an output of the temperature sensor to a reference voltage;
    a pulse signal generator coupled with the comparator and operative to generate a pulse signal with voltage hysteresis; and
    an edge triggered flip flop coupled with the pulse signal generator.

50. The invention of claim 44, wherein the memory array comprises a plurality of antifuse memory cells.

51. The invention of claim 44, wherein the memory array comprises a plurality of write-once memory cells.

52. The invention of claim 44, wherein the memory array comprises a plurality of write-many memory cells.

53. The invention of claim 44, wherein the threshold temperature comprises a thermal run-away temperature of the memory array.

54. The invention of claim 44, wherein the threshold temperature comprises a temperature greater than a thermal run-away temperature of the memory array.

55. A memory device comprising:
    a memory array;
    a temperature sensor; and
    write operation control circuitry coupled with the memory array and the temperature sensor and operative to prevent a write operation to the memory array in response to a temperature sensed by the temperature sensor reaching a threshold temperature;
    wherein the memory array comprises a plurality of write-once memory cells.

56. The invention of claim 55, wherein the write operation control circuitry is further operative to allow the write operation to be performed in response to the temperature sensed by the temperature sensor being below the threshold temperature.

57. The invention of claim 55 further comprising read operation control circuitry coupled with the memory array and operative to prevent a read operation from the memory array.

58. The invention of claim 57, wherein the read operation control circuitry is operative to prevent the read operation in response to a temperature sensed by the temperature sensor reaching a second threshold temperature.

59. The invention of claim 57 further comprising a second temperature sensor coupled with the read operation control circuitry, and wherein the read operation control circuitry is operative to prevent the read operation in response to a temperature sensed by the second temperature sensor reaching a second threshold temperature.

60. The invention of claim 55, wherein the write-operation control circuitry comprises:
    a comparator operative to compare an output of the temperature sensor to a reference voltage;
    a pulse signal generator coupled with the comparator and operative to generate a pulse signal with voltage hysteresis; and
    an edge triggered flip flop coupled with the pulse signal generator.

61. The invention of claim 55, wherein the memory array comprises a plurality of antifuse memory cells.

62. The invention of claim 55, wherein the threshold temperature comprises a thermal run-away temperature of the memory array.

63. The invention of claim 55, wherein the threshold temperature comprises a temperature greater than a thermal run-away temperature of the memory array.

64. A memory device comprising:

a memory array;

a temperature sensor; and write operation control circuitry coupled with the memory array and the temperature sensor and operative to prevent a write operation to the memory array in response to a temperature sensed by the temperature sensor reaching a threshold temperature;

wherein the memory array comprises a plurality of write-many memory cells.

65. The invention of claim 64, wherein the write operation control circuitry is further operative to allow the write operation to be performed in response to the temperature sensed by the temperature sensor being below the threshold temperature.

66. The invention of claim 64 further comprising read operation control circuitry coupled with the memory array and operative to prevent a read operation from the memory array.

67. The invention of claim 66, wherein the read operation control circuitry is operative to prevent the read operation in response to a temperature sensed by the temperature sensor reaching a second threshold temperature.

68. The invention of claim 66 further comprising a second temperature sensor coupled with the read operation control circuitry, and wherein the read operation control circuitry is operative to prevent the read operation in response to a temperature sensed by the second temperature sensor reaching a second threshold temperature.

69. The invention of claim 64, wherein the write-operation control circuitry comprises:

a comparator operative to compare an output of the temperature sensor to a reference voltage;

a pulse signal generator coupled with the comparator and operative to generate a pulse signal with voltage hysteresis; and an edge triggered flip flop coupled with the pulse signal generator.

70. The invention of claim 64, wherein the memory array comprises a plurality of antifuse memory cells.

71. The invention of claim 64, wherein the threshold temperature comprises a thermal run-away temperature of the memory array.

72. The invention of claim 64, wherein the threshold temperature comprises a temperature greater than a thermal run-away temperature of the memory array.

* * * * *